(12) United States Patent
Taeuber (10) Patent No.: US 7,791,940 B2
(45) Date of Patent: Sep. 7, 2010

(54) INTEGRATED CIRCUIT WITH SWITCHING UNIT FOR MEMORY CELL COUPLING, AND METHOD FOR PRODUCING AN INTEGRATED CIRCUIT FOR MEMORY CELL COUPLING

(75) Inventor: Andreas Taeuber, Unterschleissheim (DE)

(73) Assignee: Qimonda AG, Munich (DE)

( * ) Notice: Subject to any disclaimer, the term of this patent is extended or adjusted under 35 U.S.C. 154(b) by 187 days.

(21) Appl. No.: 12/248,505

(22) Filed: Oct. 9, 2008

(65) Prior Publication Data
US 2009/0091976 A1   Apr. 9, 2009

(30) Foreign Application Priority Data
Oct. 9, 2007   (DE) .................. 10 2007 048 306

(51) Int. Cl.
G11C 16/04   (2006.01)
(52) U.S. Cl. .................... 365/185.05; 365/185.07; 365/185.12; 365/185.13
(58) Field of Classification Search ............ 365/185.05, 365/185.07, 185.12, 185.13
See application file for complete search history.

(56) References Cited

U.S. PATENT DOCUMENTS

| 5,777,941 | A |   | 7/1998 | Pascucci |   |
|---|---|---|---|---|---|
| 5,917,744 | A |   | 6/1999 | Kirihata et al. |   |
| 7,366,015 | B2 | * | 4/2008 | Kobayashi et al. | ...... 365/185.05 |
| 7,405,971 | B2 | * | 7/2008 | Shukuri et al. | ......... 365/185.05 |
| 7,495,958 | B2 | * | 2/2009 | Chih | ..................... 365/185.13 |

* cited by examiner

Primary Examiner—Pho M Luu (57) ABSTRACT

An integrated circuit has a plurality of first memory cells, which are electrically coupled along a first line, and additionally has a plurality of second memory cells which are electrically coupled along a second line. The integrated circuit furthermore has a switching unit having a plurality of switching elements having in turn a first contact and a second contact. The first contact of a first switching element is coupled to the plurality of first memory cells, and the first contact of a second switching element is coupled to the plurality of second memory cells. In addition, the first contact of a third switching element is coupled to the second contact of the first switching element, and the first contact of a fourth switching element is coupled to the second contact of the second switching element.

24 Claims, 7 Drawing Sheets

FIG 1

Prior Art

INTEGRATED CIRCUIT WITH SWITCHING UNIT FOR MEMORY CELL COUPLING, AND METHOD FOR PRODUCING AN INTEGRATED CIRCUIT FOR MEMORY CELL COUPLING

This application claims priority to German Patent Application DE 10 2007 048 306.8, which was filed Oct. 9, 2007 and is incorporated herein by reference.

TECHNICAL FIELD

The invention relates to an integrated circuit with switching unit for memory cell coupling, and to a method for producing such an integrated circuit.

BACKGROUND

During the operation of integrated circuits, when erasing flash memory elements, high voltages are applied to the die of the integrated circuit, e.g., to the doping well, e.g., a p-type well of the memory array.

Due to electrical couplings such as, e.g., alternating-current couplings or, e.g., capacitive couplings during erasure with high voltages, the floating interconnects such as bit lines that are arranged above a doping well are at a correspondingly high potential.

The bit lines are coupled for the purpose of coupling the memory cells to, e.g., read-out circuits with multiplexers that are arranged outside the memory array and thus above a further doping well, and occupy a relatively large area of the die of the integrated circuit.

If a multiplexer output is at a low potential, e.g., at 0 volts, then high electric fields that can exceed the breakdown field strength occur between adjacent lines of the inputs and outputs of the multiplexer switching elements coupled to the different bit lines.

Figure 1:
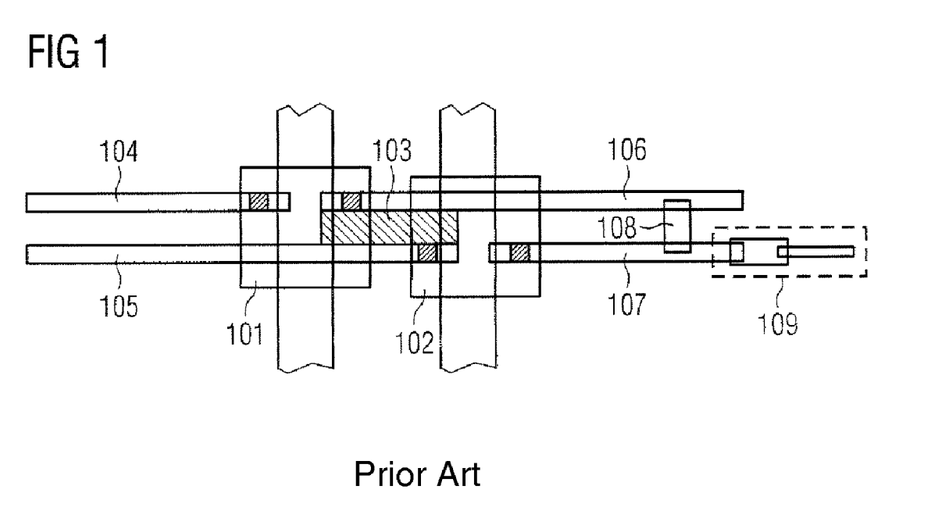
FIG. 1 shows a schematic plan view of a multiplexer arrangement in accordance with the prior art.

FIG. 1 shows a plan view of a 2:1 multiplexer in accordance with the prior art. The illustration shows a first switching element 101 and a second switching element 102, wherein the first switching element 101 is coupled by the input to the first bit line 104 and the second switching element 102 is coupled by the input to the second bit line 105. The switching elements 101 and 102 of the multiplexer, which are larger than the memory elements, are arranged in offset fashion (stacked) in order to save space, or in order to be adapted to the distance between the conductive structures such as the bit lines. The bit lines 104, 105 are arranged above the switching elements and the bit lines 104, 105 are coupled to the switching elements by means of contact vias.

The output of the first switching element 101 is coupled to the first bit line section 106 and the output of the second switching element 102 is coupled to the second bit line section 107. The output of the first switching element 101 is coupled by means of an electrical connection 108 to the output of the second switching element 102 and to an output 109.

Depending on the driving of the switching elements 101, 102, the first bit line 104 or the second bit line 105 can be coupled to the output 109.

During the erasure of the memory elements, the first bit line 104 and the second bit line 105 are at a high potential, e.g., as a result of the capacitive coupling or AC voltage coupling. A low potential, e.g., 0 volts is present at the output 109.

In the case of the geometric arrangement of the components shown (i.e., device stacking), a region, identified by the area 103, is present in which the electric field can be particularly high due to the high potential present on the second bit line 105 and the low potential present on the first bit line section 106.

Primarily if the pitch spacings of the integrated circuit are reduced for the purpose of miniaturizing the structures, the breakdown field strength can be exceeded in such a region indicated by the area 103.

BRIEF DESCRIPTION OF THE DRAWINGS

Exemplary embodiments of the invention are illustrated in the figures and are explained in more detail below. In the figures.

DETAILED DESCRIPTION

Figure 2A:
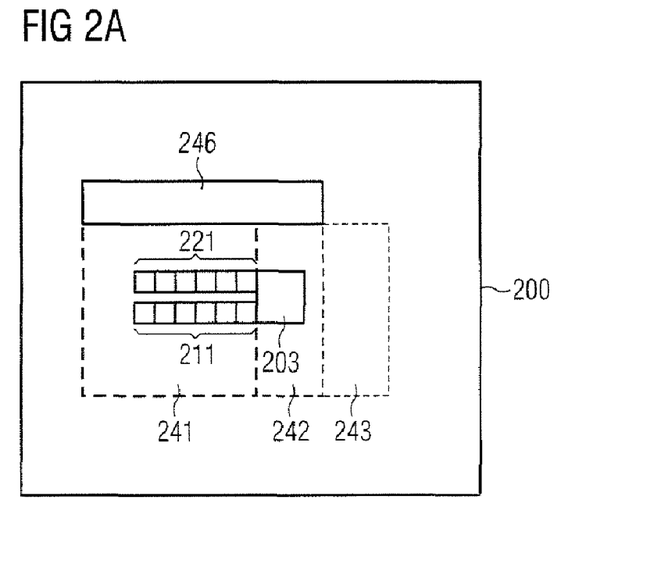
FIG. 2a shows a schematic plan view of an integrated circuit comprising a switching unit, two memory element strings and a control unit in accordance with one exemplary embodiment of the invention.

Referring first to FIG. 2a, an integrated circuit 200 has a plurality of first memory cells 211, which are electrically coupled along a first line, and also has a plurality of second memory cells 221, which are electrically coupled along a second line.

Figure 2B:
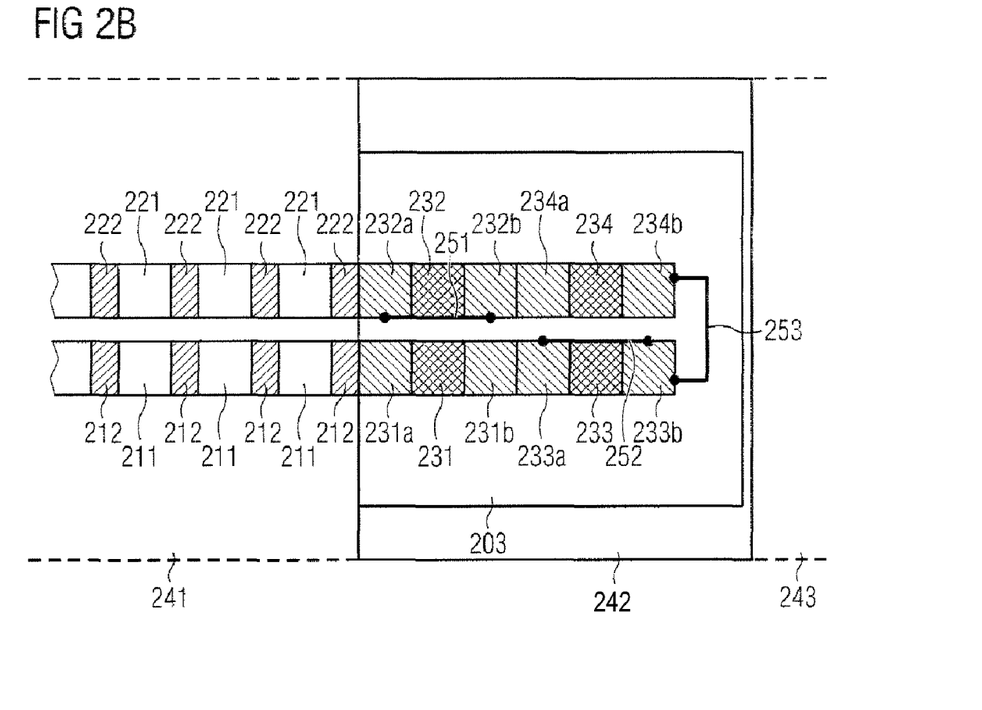
FIG. 2b shows a schematic plan view of a switching unit with two memory element strings in accordance with one exemplary embodiment of the invention.

As shown in FIG. 2b, the integrated circuit furthermore has a switching unit 203 comprising a plurality of switching elements 231, 232, 233, 234, having in turn a first contact 231a, 232a, 233a, 234a and a second contact 231b, 232b, 233b, 234b.

The first contact 231a of a first switching element 231 is coupled to the plurality of first memory cells 211, and the first contact 232a of a second switching element 232 is coupled to the plurality of second memory cells 221.

In addition, the first contact 233a of a third switching element 233 is coupled to the second contact 231b of the first switching element 231, and the first contact 234a of a fourth switching element 234 is coupled to the second contact 232b of the second switching element 232.

The first contact 232a of the second switching element 232 and the second contact 232b of the second switching element 232 are electrically short-circuited and, in addition, the first contact 233a of the third switching element 233 and the second contact 233b of the third switching element 233 are electrically short-circuited.

In addition, a second electrical connection 252 couples the second contact 233b of the third switching element 233 and the second contact 234b of the fourth switching element 234.

In a method for producing an integrated circuit 200, a plurality of first memory cells 211, which are electrically coupled, are formed along a first line, and a plurality of second memory cells 221, which are electrically coupled, are furthermore formed along a second line.

A switching unit 203 comprising a plurality of switching elements 231, 232, 233, 234 having respectively a first contact 231a, 232a, 233a, 234a and respectively a second contact 231b, 232b, 233b, 234b is formed.

In this case, the first contact 231a of a first switching element 231 of the switching unit 203 is coupled to the plurality of first memory cells 211, and the first contact 232a of a second switching element 232 of the switching unit 203 is coupled to the plurality of second memory cells 221.

In the case of this switching unit 203, the first contact 233a of a third switching element 233 is coupled to the second contact 231b of the first switching element 231, and the first contact 234a of a fourth switching element 234 is coupled to the second contact 232b of the second switching element 232.

The first contact 232a of the second switching element 232 and the second contact 232b of the second switching element 232 of the switching unit 203 are electrically short-circuited, and the first contact 233a of the third switching element 233 and the second contact 233b of the third switching element 233 are electrically short-circuited.

The second contact 233b of the third switching element 233 and the second contact 234b of the fourth switching element 234 are coupled by means of an electrical connection 253.

By means of this integrated circuit, in accordance with one example of the invention, the distance between the terminals that couple the plurality of the memory cells to other assemblies of the integrated circuit, e.g., for the evaluation of the memory cells is reduced since the switching elements are arranged and established in such a way that they can optionally couple the plurality of first memory cells and also the plurality of second memory cells to the electrical connection of the second contacts of the third and of the fourth switching element.

Furthermore, this integrated circuit makes it possible for the switching elements to be able to be integrated into the sequence of the construction of the memory cells and thus to be able to be fabricated with the same pitch grid (ground rule). This also gives rise to the possibility of being able to construct the integrated circuit with a smaller area requirement.

In accordance with one example of the invention, the arrangement and establishment of the switching elements corresponds to an N:1 multiplexer and can perform a multiplexer function. By way of example, the switching elements 231, 232, 233, 234 in the switching unit 203 are arranged in such a way that the circuit corresponds to a 2:1 multiplexer.

In accordance with a further example, a 2:1 multiplexer is arranged within the memory array.

The memory access circuit thus implemented, e.g., in the form of a bit line multiplexer established above the doping well of the memory array reduces by a factor of two the distance between the conductive structures, such as the bit lines, for example, which have to be coupled from the memory cell array to other regions of the integrated circuit.

This results in a relaxation of the pitch spacing of the bit lines and thus of the electric fields, between the bit lines. In other words, the insulation between the bit lines or other conductive structures is improved.

When high voltages, e.g., 20 V are applied to the die or to the doping well of the memory cell array, the bit lines are still raised to a high potential but, since at least one stage of the bit line multiplexer is arranged above the memory cell array and thus above the doping well of the memory cell array, no potential difference occurs between the bit lines that are arranged above the doping well of the memory cell array.

In accordance with one exemplary embodiment of the invention, the coupling of the bit lines to circuit parts of the integrated circuit outside the memory cell array is effected, however, by means of connecting lines having a doubled spacing by comparison with the bit lines above the memory cells.

In accordance with one exemplary embodiment of the invention, the switching elements of the switching unit can be formed on the basis of the same technology and the same pitch or the same ground rule as the memory cells. In other words, with such a layout, it is possible to save area on the die compared with multiplexers of conventional design. The switching elements can therefore be constructed from the same low-voltage (low dielectric strength) transistor basic structures as the memory cells.

Further switching elements that arise due to the technological production process for the memory cell array but are not required for the construction of the switching unit or the coupling thereof can be kept as redundant switching elements or be short-circuited by means of electrical bridges.

In this case, it should generally be noted that the technology of the fabrication of the integrated circuits, for the very small patternings, only permits structures having a certain minimum pitch spacing, and even this only in one direction with respect to the patterning, since the optical exposure possibilities have an orientation.

This means that the choice of the size of the components is subject to certain technological rules. Therefore, if the switching elements are fabricated by means of the technology of the memory elements, the resulting switching elements become correspondingly smaller than if they are fabricated in accordance with the technology of the peripheral components.

By way of example, such a construction of an integrated circuit that couples the switching elements to a multiplexer stage above the doping well such as, e.g., an insulated p-doping well of the memory cell array enables smaller structure spacings in the construction of the integrated circuit.

In other words, the arrangement of at least one stage of a multiplexer circuit, e.g., of a 2:1 multiplexer, within the memory cell array makes it possible to increase the spacing of the coupling lines with respect to the drive circuits of the integrated circuit by, e.g., a factor of two.

The embodiments set out below are correspondingly applicable to the integrated circuit and also to the method for producing the integrated circuit.

In one embodiment of the invention, the second switching element can be electrically short-circuited by means of a first bridge, and the third switching element can be electrically short-circuited by means of a second bridge.

Figure 3A:
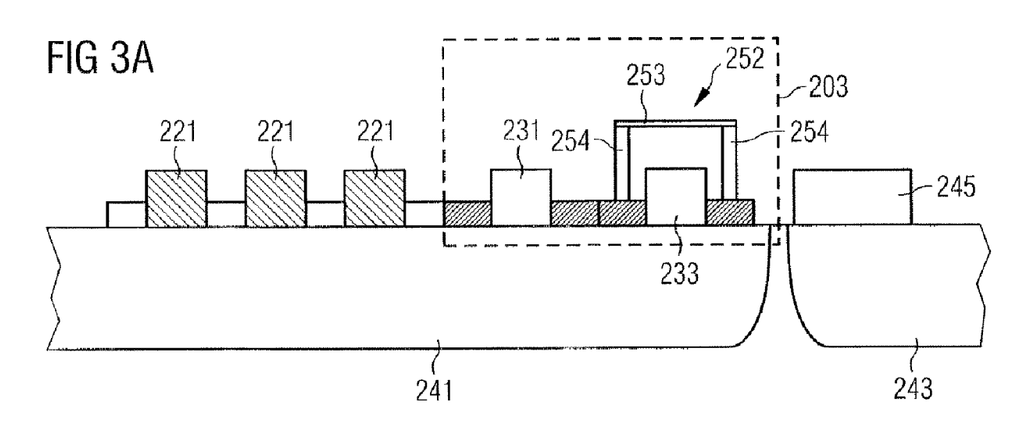
FIG. 3a shows a cross-sectional view of a switching unit coupled to memory cells with two doping wells in accordance with one exemplary embodiment of the invention.

FIG. 3a shows a cross-sectional view of such a construction. In this case, the sectional area is chosen through a line in which the plurality of the memory cells 211 are arranged. The third switching element 233 is illustrated schematically here as a transistor and is short-circuited by means of the second conductive bridge 252, which is formed here by two contact vias 254 and an interconnect 255.

In accordance with one embodiment of the invention, the first electrical bridge 251 is arranged above the second switching element 232, and the second electrical bridge 252 is arranged above the third switching element 233. FIG. 3a shows, in the cross-sectional view, the second electrical bridge 252 above the third switching element 233.

The electrical short-circuiting of the switching elements can be effected by diverse technological devices and measures, for example, including by applying an additional electrically conductive layer provided that the deposition of the layer can be integrated into the technological fabrication sequence. In addition, the conductivity of other structures such as, e.g., of the channel region of a switching element transistor can also be increased by doping, such that the switching element is short-circuited in this way.

The first electrical bridge 251 and the second electrical bridge 252 can each have a bit line. The bit line can run above the memory cells 221 and 211, respectively, and the switching elements 231, 232, 233, 234, and this structure can thus be used to short-circuit the switching elements which are not required for the function of the switching unit 203 and which arise, e.g., on account of the technological fabrication process.

In accordance with one embodiment, the memory cells 221, 211 are arranged above a first doping well 241 (FIG. 3b), and the switching elements 231, 232, 233, 234 are arranged above a second doping well 242 and the integrated circuit 200 has a control unit 246 (FIG. 2a). The control unit 246, which is coupled to the first doping well 241 and to the second doping well 242, is coupled and established in such a way that the first doping well 241 and the second doping well 242 approach the same potential during the erasure of the memory cells 211, 221.

Figure 3B:
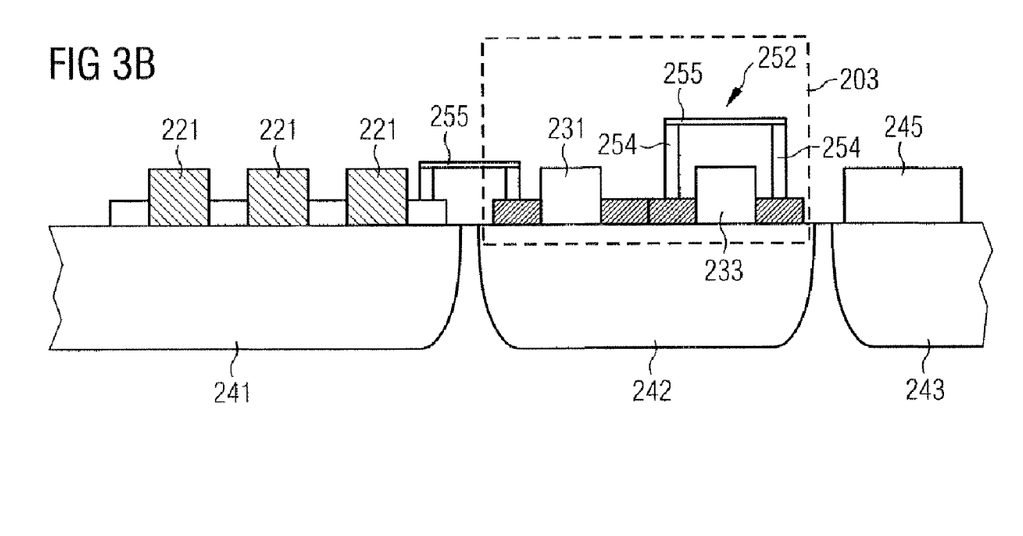
FIG. 3b shows a cross-sectional view of a switching unit coupled to memory cells with three doping wells in accordance with one exemplary embodiment of the invention.

In accordance with one embodiment, the first doping well 241 and the second doping well 242 are coupled in such a way that the potential difference between the first doping well 241 and the second doping well 242 is less than 5 volts.

Alternatively, the first doping well 241 and the second doping well 242 are coupled in such a way that the potential difference between the first doping well 241 and the second doping well 242 is less than 1 volt.

In accordance with one embodiment of the invention, the first doping well 241 and the second doping well 242 are coupled in such a way that the potential difference between the first doping well 241 and the second doping well 242 during an erasure operation of the memory cells is less than 5 volts.

In accordance with a further configuration of the invention, the second doping well 242 can be contained in the first doping well 241. The cross-sectional view of the switching unit 203 with memory cells 211, 221 in FIG. 3a corresponds to FIG. 3b with the first difference that in the cross-sectional view in accordance with FIG. 3a, the second doping well 242 is contained in the first doping well 241. The second difference is that an electrical connection 255 couples the memory cells 221 to the switching unit 203.

Alternatively, the second doping well 242 can be contained in the first doping well 241 and the integrated circuit 200 can have at least a third doping well 243 as illustrated in FIGS. 2a, 2b, 3a and 3b.

In accordance with one embodiment of the invention, power transistors 245 can be established and arranged above the third doping well 243, and the first doping well 241 and the second doping well 242 and the third doping well 243 can be arranged and established in such a way that, during an erasure operation of the memory cells 211, 221, the first doping well 241 has a first erase potential and the second doping well 242 has a second erase potential and the third doping well 243 has a third erase potential. The first erase potential and/or the second erase potential can be different from the potential of the third doping well 243 during the erasure operation.

In accordance with one embodiment, the plurality of switching elements and the plurality of memory elements can be arranged on the same active region.

The memory elements 211, 221 can have nonvolatile memory elements. For example, the memory elements 211, 221 can have floating gate memory transistors. Alternatively, the memory elements 211, 221 can have charge trapping memory transistors.

Furthermore, at least one of the switching elements 231, 232, 233, 234 can have a field effect transistor.

Furthermore, the plurality of the memory elements 211, 221 can have a source terminal and a drain terminal, and a respective memory element of the plurality of the memory elements 211, 221 can be coupled by means of its source terminal to the drain terminal of another memory element of the plurality of the memory elements.

The plurality of the memory elements 211, 221 can form a plurality of memory element strings.

Figure 4A:
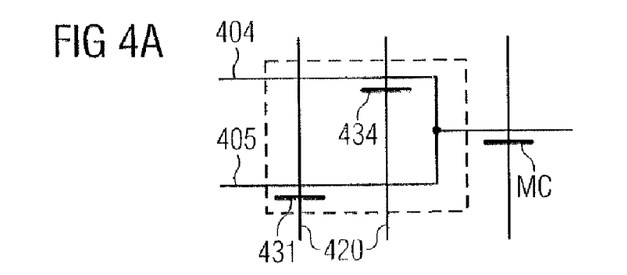
FIG. 4a shows a schematic diagram of a 2:1 multiplexer.
Figure 4B:
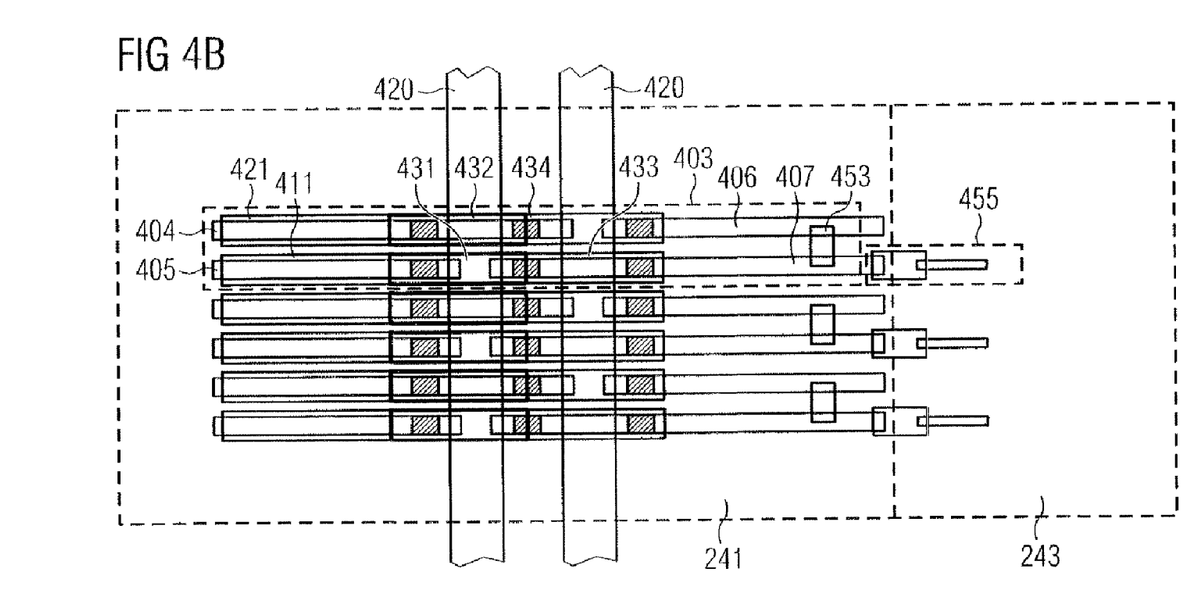
FIG. 4b shows a schematic plan view of an arrangement having switching units which form three 2:1 multiplexers in accordance with one exemplary embodiment of the invention.

FIG. 4a shows the circuit diagram of a 2:1 multiplexer for elucidating an example of the invention as illustrated in FIG. 4b. One of the three switching units 403 illustrated is identified for clarification purposes. In accordance with the above-described construction of the switching unit, the switching elements 432 and 434 are electrically coupled and the switching element 432 is electrically coupled to the plurality of coupled memory cells 421. The switching elements 431 and 433 are electrically coupled and the switching element 431 is electrically coupled to the plurality of coupled memory cells 411. The second switching element 432 is short-circuited by means of the first bit line 404 and contact vias that couple the bit line 404 to the terminals of the second switching element 432.

The third switching element 433 is short-circuited by means of the second output line 407 and contact vias that couple the second output line 407 to the terminals of the third switching element 433.

The second output line 407 is coupled to the third switching element 433 and the first output line 406 is coupled to the fourth switching element 434. The connecting element 453 couples the first output line 406 to the second output line 407.

The switching elements can be controlled by the control lines 420, e.g., by means of the application of potentials.

Figures 5A, 5B:
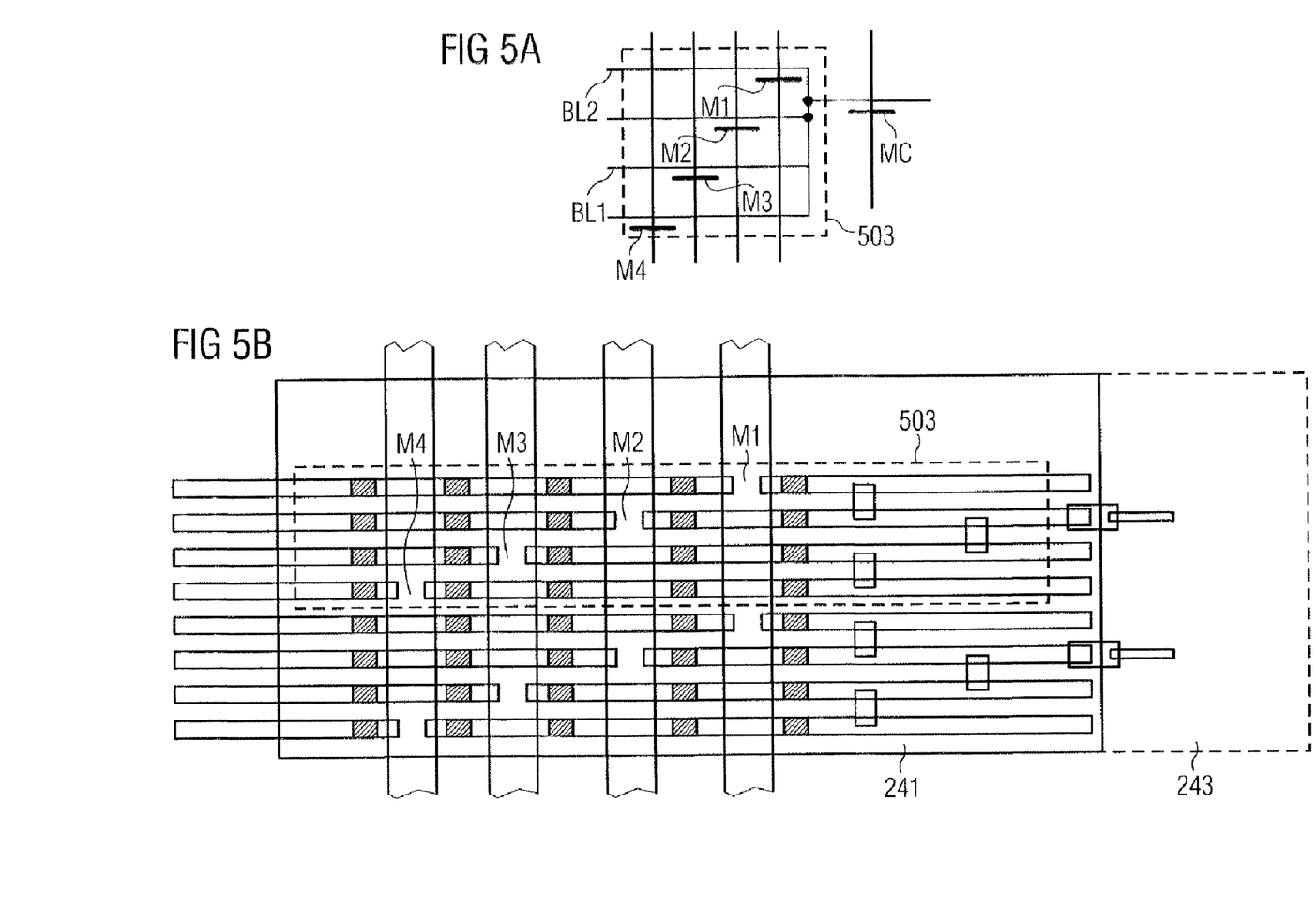
FIG. 5a shows a schematic diagram of a 4:1 multiplexer.
FIG. 5b shows a schematic plan view of an arrangement comprising switching units which form two 4:1 multiplexers in accordance with one embodiment of the invention.
Figure 6A:
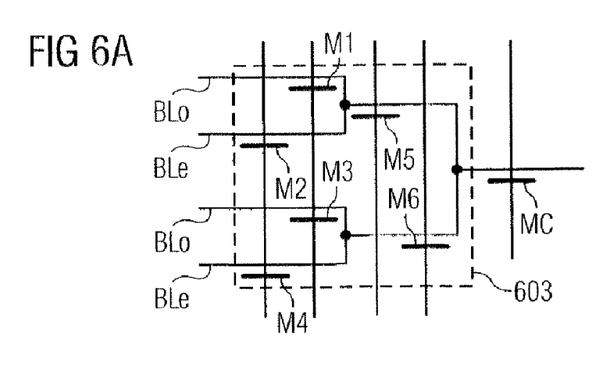
FIG. 6a shows a schematic diagram of a hierarchical 4:1 multiplexer.

The transistor MC in FIGS. 4a, 5a, 6a is depicted for clarification purposes. The transistor MC can be arranged above the third doping well 243 and insulates the rest of the integrated circuit 200, e.g., from the high voltage that occurs, e.g., during the erasure of the memory cells 221, 211.

To put it another way, in the embodiment in FIG. 4b, the memory cells 211, 221 and the switching arrangement 203 are arranged above the doping well 241. What is thereby achieved is that all the bit lines such as, e.g., the bit lines 404 and 405 and the output terminals such as, e.g., 406 and 407 are at the same potential during erasure and, consequently, no voltages occur between the interconnects described.

In accordance with FIG. 4b, the terminals 455 that couple the memory cells to the peripheral part of the integrated circuit can be embodied with double the mutual distance and, consequently, the electric field that possibly occurs between said terminals becomes correspondingly smaller.

In accordance with a further embodiment of the invention, three switching units 203 can be arranged and established in such a way that they form a 4:1 multiplexer.

Figure 6B:
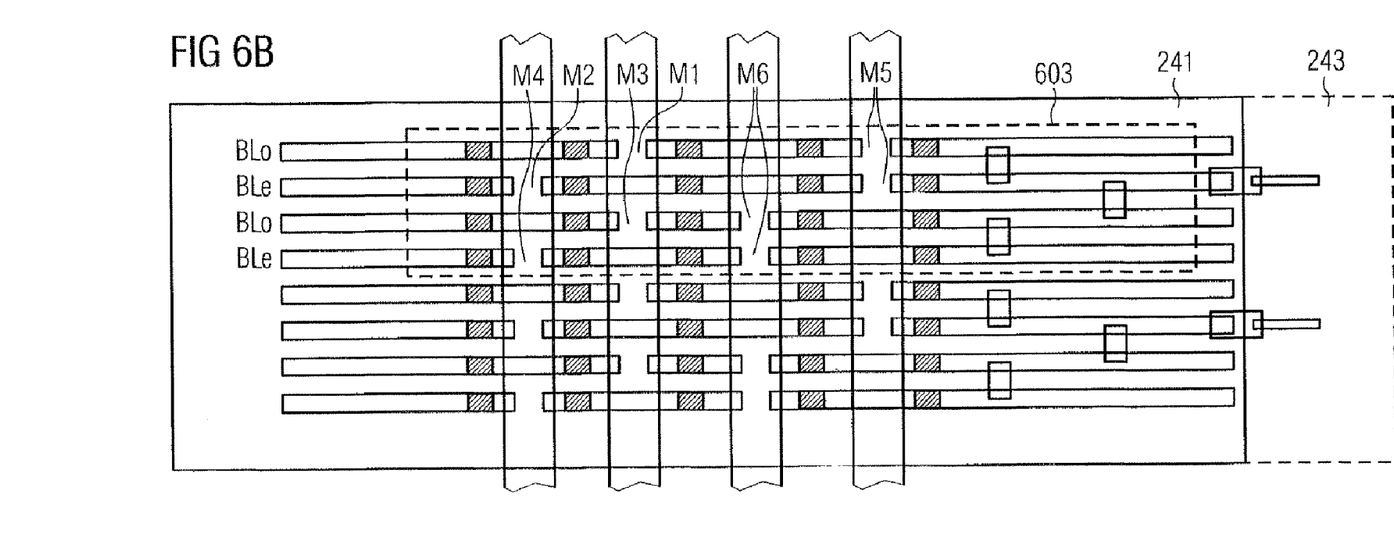
FIG. 6b shows a schematic plan view of an arrangement comprising switching units which form two hierarchical 4:1 multiplexers in accordance with one embodiment of the invention.

FIG. 5b and FIG. 6b show further possibilities wherein the switching elements described can be arranged for reading out the memory contents of the memory cells. The arrangement of the switching elements can in each case be attributed to a coupling of switching units 203, as becomes immediately apparent from FIGS. 5a and 6a.

FIG. 5b and FIG. 6b illustrate only the bit lines in each case, since the memory cells and the switching elements are always arranged in the same grid owing to technological dictates.

It is therefore apparent from FIG. 5b that for the example of a 4:1 multiplexer for each memory cell string four switching elements are coupled to one another and it becomes immediately apparent which of the switching elements are short-circuited by means of the bit line.

The 4:1 multiplexer can be coupled to four of the memory element strings in order to read out the memory content of the four memory element strings by means of the 4:1 multiplexer. It becomes apparent from FIG. 6b which switching elements are short-circuited in order to form a hierarchical 4:1 multiplexer from the arrangement of switching elements. By way of example, three switching units can be arranged and established in such a way that they form a hierarchical 4:1 multiplexer.

It should generally be noted that according to the invention a great plurality of arrangements of the switching elements are possible over and above the examples specified. Thus, circuit arrangements with odd-numbered switching element arrangements or else N:1 multiplexer arrangements are also possible in order to realize the read-out of the memory content.

Figure 7A:
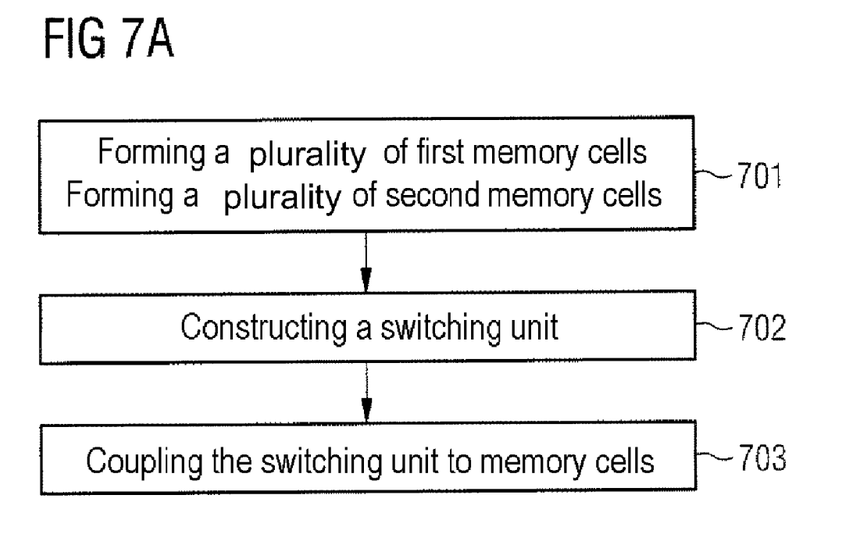
FIG. 7a shows a flowchart illustrating a method for producing an integrated circuit in accordance with one embodiment of the invention.

FIG. 7a shows a method for producing the integrated circuit 200.

In step 701, a plurality of first memory cells 211, which are electrically coupled, are formed along a first line, and a plurality of second memory cells 221, which are electrically coupled, are furthermore formed along a second line.

In step 702, a switching unit 203 is formed.

In step 703, the switching unit is coupled to the memory cells. For this purpose, the first contact 231a of a first switching element 231 of the switching unit 203 is coupled to the plurality of first memory cells 211, and the first contact 232a of a second switching element 232 of the switching unit 203 is coupled to the plurality of second memory cells 221.

Figure 7B:
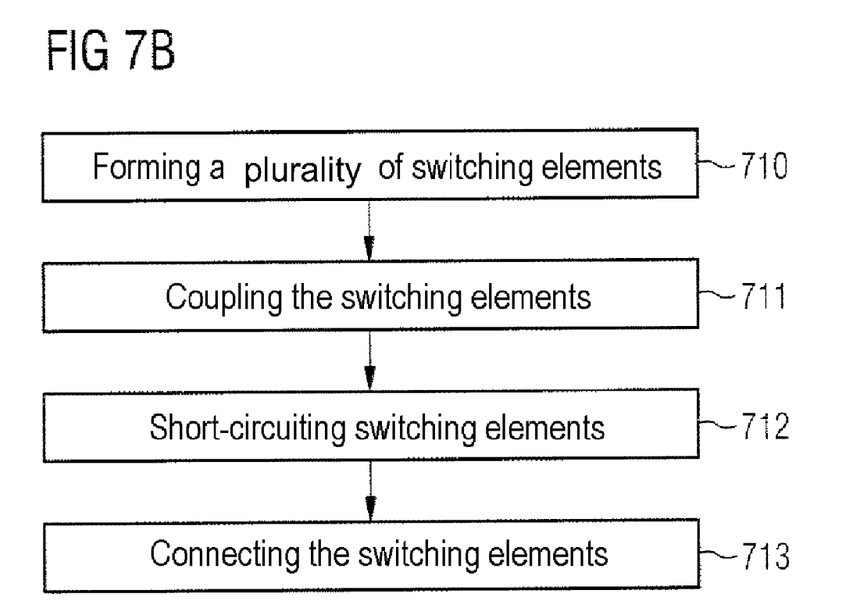
FIG. 7b shows a flowchart illustrating a method for constructing a switching unit in accordance with one exemplary embodiment of the invention.

FIG. 7b shows a method of step 702 for forming a switching unit 203.

In step 710, a plurality of switching elements 231, 232, 233, 234 having respectively a first contact 231a, 232a, 233a, 234a and respectively a second contact 231b, 232b, 233b, 234b are formed.

In step 711, the switching elements are coupled. For this purpose, the first contact 233a of a third switching element 233 is coupled to the second contact 231b of the first switching element 231, and the first contact 234a of a fourth switching element 234 is coupled to the second contact 232b of the second switching element 232.

In step 712, switching elements are short-circuited. For this purpose, the first contact 232a of the second switching element 232 and the second contact 232b of the second switching element 232 of the switching unit 203 are electrically short-circuited, and the first contact 233a of the third switching element 233 and the second contact 233b of the third switching element 233 are electrically short-circuited.

In step 713, the switching elements are connected. For this purpose, the second contact 233b of the third switching element 233 and the second contact 234b of the fourth switching element 234 are coupled by means of an electrical connection 253.

What is claimed is:

1. An integrated circuit, comprising:
    a plurality of first memory cells, which are electrically coupled along a first line;
    a plurality of second memory cells, which are electrically coupled along a second line;
    a switching unit comprising a plurality of switching elements, each switching element comprising a first contact and a second contact;
    wherein the first contact of a first switching element is coupled to the plurality of first memory cells;
    wherein the first contact of a second switching element is coupled to the plurality of second memory cells;
    wherein the first contact of a third switching element is coupled to the second contact of the first switching element;
    wherein the first contact of a fourth switching element is coupled to the second contact of the second switching element;
    wherein the first contact of the second switching element and the second contact of the second switching element are electrically short-circuited;
    wherein the first contact of the third switching element and the second contact of the third switching element are electrically short-circuited; and
    wherein an electrical connection couples the second contact of the third switching element and the second contact of the fourth switching element.

2. The integrated circuit as claimed in claim 1, wherein the second switching element is electrically short-circuited by means of a first bridge, and the third switching element is electrically short-circuited by means of a second bridge.

3. The integrated circuit as claimed in claim 2, wherein the first electrical bridge is arranged above the second switching element, and the second electrical bridge is arranged above the third switching element.

4. The integrated circuit as claimed in claim 1, wherein the first electrical bridge and the second electrical bridge each have a bit line.

5. The integrated circuit as claimed in claim 1, wherein the memory cells are arranged above a first doping well and the switching elements are arranged above a second doping well.

6. The integrated circuit as claimed in claim 5, wherein the integrated circuit has a control unit that is coupled to the first doping well and to the second doping well in such a way that during the erasure of the memory cells, it is possible to set the potential between the first doping well and the second doping well.

7. The integrated circuit as claimed in claim 6, wherein the first doping well and the second doping well are coupled in such a way that the potential difference between the first doping well and the second doping well is less than 5 volts.

8. The integrated circuit as claimed in claim 6, wherein the first doping well and the second doping well are coupled in such a way that the potential difference between the first doping well and the second doping well is less than 1 volt.

9. The integrated circuit as claimed in claim 6, wherein the first doping well and the second doping well are coupled in such a way that the first doping well and the second doping well approach the same potential.

10. The integrated circuit as claimed in claim 6, wherein the first doping well and the second doping well are coupled in such a way that the potential difference between the first doping well and the second doping well during an erasure operation of the memory cells is less than 5 volts.

11. The integrated circuit as claimed in claim 5, wherein the second doping well is contained in the first doping well.

12. The integrated circuit as claimed in claim 5, wherein the second doping well is contained in the first doping well and the integrated circuit has at least a third doping well.

13. The integrated circuit as claimed in claim 12, further comprising:
    a third doping well;
    power transistors arranged above the third doping well; and
    wherein the first doping well, the second doping well and the third doping well are arranged and established in such a way that, during an erasure operation of the memory cells,
    the first doping well has a first erase potential,
    the second doping well has a second erase potential,
    the third doping well has a third erase potential, and
    the first erase potential or the second erase potential is different from the third erase potential.

14. The integrated circuit as claimed in claim 1, wherein the plurality of switching elements and the plurality of memory elements are arranged on the same active region.

15. The integrated circuit as claimed in claim 1, wherein the memory elements comprise nonvolatile memory elements.

16. The integrated circuit as claimed in claim 1, wherein the memory elements comprise floating gate memory transistors.

17. The integrated circuit as claimed in claim 1, wherein the memory elements comprise charge trapping memory transistors.

18. The integrated circuit as claimed in claim 1, wherein at least one of the switching elements comprises a field effect transistor.

19. The integrated circuit as claimed in claim 1,
    wherein the plurality of the memory elements comprise a source terminal and a drain terminal; and
    wherein a respective memory element of the plurality of the memory elements is coupled by means of its source terminal to the drain terminal of another memory element of the plurality of the memory elements.

20. The integrated circuit as claimed in claim 1, wherein the plurality of the memory elements forms a plurality of memory element strings.

21. The integrated circuit as claimed in claim 1, wherein three switching units are arranged and established in such a way that they form a 4:1 multiplexer.

22. The integrated circuit as claimed in claim 21, wherein the 4:1 multiplexer is coupled to four of the memory element strings in order to read out the memory content of the four memory element strings by means of the 4:1 multiplexer.

23. The integrated circuit as claimed in claim 1, wherein three switching units are arranged and established in such a way that they form a hierarchical 4:1 multiplexer.

24. A method for producing an integrated circuit, the method comprising:
    forming a plurality of first memory cells along a first line, said first memory cells being electrically coupled;
    forming a plurality of second memory cells along a second line, said second memory cells being electrically coupled; and
    forming a switching unit comprising a plurality of switching elements comprising a first contact and a second contact;
    wherein the first contact of a first switching element is coupled to the plurality of first memory cells;
    wherein the first contact of a second switching element is coupled to the plurality of second memory cells;
    wherein the first contact of a third switching element is coupled to the second contact of the first switching element;
    wherein the first contact of a fourth switching element is coupled to the second contact of the second switching element;
    wherein the first contact of the second switching element and the second contact of the second switching element are electrically short-circuited by means of a first bridge; and wherein the first contact of the third switching element and the second contact of the third switching element are electrically short-circuited by means of a second bridge; and
    wherein an electrical connection couples the second contact of the third switching element and the second contact of the fourth switching element.

* * * * *